United States Patent [19]
Yu et al.

[11] Patent Number: 6,100,593
[45] Date of Patent: Aug. 8, 2000

[54] MULTIPLE CHIP HYBRID PACKAGE USING BUMP TECHNOLOGY

[75] Inventors: Allen S. Yu, Fremont; Paul J. Steffan, Elk Grove; Thomas C. Scholer, San Jose, all of Calif.

[73] Assignee: Advanced Micro Devices, Inc., Sunnyvale, Calif.

[21] Appl. No.: 09/032,362

[22] Filed: Feb. 27, 1998

[51] Int. Cl.[7] .......................... H01L 23/48; H01L 23/52; H01L 29/40

[52] U.S. Cl. .................. 257/777; 257/685; 257/686; 257/778

[58] Field of Search ................................ 257/777, 685, 257/686, 778, 723, 724

[56] References Cited

U.S. PATENT DOCUMENTS

| | | |
|---|---|---|
| 4,074,342 | 2/1978 | Honn et al. . |
| 5,266,912 | 11/1993 | Kledzik . |
| 5,404,044 | 4/1995 | Booth . |

*Primary Examiner*—Sheila V. Clark
*Attorney, Agent, or Firm*—H. Donald Nelson

[57] ABSTRACT

A multiple chip hybrid package using bump technology having multiple chips electrically connected using a flip chip technology such as solder bump technology. Portion of at least one chip is electrically connected to electrical leads connecting terminals inside the package to pins outside the package.

4 Claims, 2 Drawing Sheets

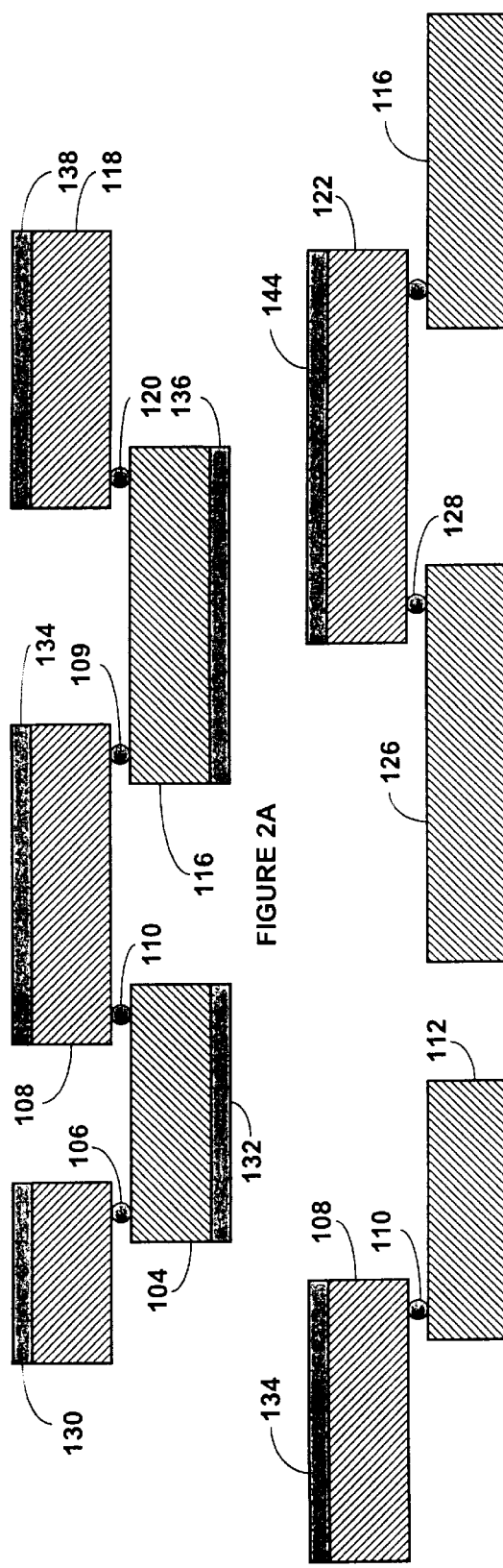

MULTIPLE CHIP HYBRID PACKAGE USING BUMP TECHNOLOGY

BACKGROUND OF THE INVENTION

1. Cross-Reference to Related Applications

This application is related to application, Ser. No. 09/032,398, entitled MULTI-CHIP PACKAGING USING BUMP TECHNOLOGY, filed on the filing date of this application and assigned to the assignee of this application.

2. Field of the Invention

This invention relates generally to a method of interconnecting multiple semiconductor chips in a single package. More specifically, this invention relates to a method of interconnecting multiple semiconductor chips in a single package using flip chip technology. Even more specifically, this invention relates to a method of interconnecting multiple semiconductor chips in a single package using solder bump technology.

3. Discussion of the Related Art

The semiconductor industry is increasingly characterized by a growing trend towards integrating more integrated semiconductor circuits on a given semiconductor chip. In addition, the circuits are becoming more complex in order to provide the higher performance required by end users of the semiconductor chips. To achieve the higher performance demanded by end users it is necessary to not only provide more complexity in the circuits and functions, but also to ensure that the circuits are smaller and faster. This is being achieved by not only reducing the size of individual devices but by placing the circuits and circuit elements closer together. In turn, this means that more circuits have to be interconnected. Some of the circuits that are interconnected are on separate chips. The method of interconnection on a single chip as well as interconnections between separate chips must not detract from the performance and speed of the various functions on the semiconductor chips.

Interconnections provide paths or mediums for electrical signals that are delivered from source devices to destination or load devices. Because one of the major problems associated with interconnections is that the passage of electrical signals through interconnections takes time, the performance of the interconnected circuits is degraded. Another problem with interconnections is that interconnections have finite resistances that cause heat to be generated in the chips that must be dissipated. In order to decrease the time interval of the passage of electrical signals from one device to another and to decrease the amount of generated heat, the trend in the semiconductor industry is to integrate peripheral devices, such as cache memory devices, onto a single monolithic device. The integration of the peripheral devices onto a single chip improves signal processing, timing and performance of the integrated circuits as well as reduces generated heat. However, the integration places a greater strain on the fabrication of the integrated device.

With shrinking geometries and therefore greater device densities, an ever-smaller single defect can kill an entire single integrated device. As can be appreciated, the larger the die, the higher probability that a single defect can kill the device. Yield is a measure of good die obtained from a wager. Since net good die on a wafer is inversely proportional to the size of the die, one approach to increase yield would be to separate out the major components of a highly integrated device into its individual components on different chips. The resultant "silicon" yield of the individual components will exceed the silicon yield of the single monolithic device, by an appreciable measure.

One of the current methods to package semiconductor devices is flip chip technology in which a chip has either solder bumps or bond pads on the active face of the chip. Flip chip technology is defined as mounting the semiconductor chip to a substrate with any kind of interconnect materials and methods such as fluxless solder bumps, tape-automated bonding (TAB), wire interconnects, conductive polymers, anisotropic conductive adhesives, metallurgy bumps, compliant bumps, and pressure contacts as long as the active chip surface is facing the substrate (the package). In one method, the chip is placed face down onto a package so the solder bumps or bond pads on the chip are aligned and contact solder bumps or bond pads on the package. The device is reflowed (heated) so that the solder bumps and bond pads form metallurgical bonds.

Presently, there is a tradeoff between integrating more peripheral devices onto a single monolithic chip to achieve improved performance but with decreased yield or sacrificing performance for improved yield by using separate chips.

Therefore, what is needed is a method of interconnecting multiple semiconductor integrated circuits to obtain improved performance and at the same time obtaining improved yield.

SUMMARY OF THE INVENTION

According to the present invention, the foregoing and other objects and advantages are attained by a multichip hybrid package and a method of assembling the multichip hybrid package in which multiple chips are interconnected using flip chip technology. One or more of the chips in the package are electrically connected to electrical leads in the package that connect terminals inside the package to pins outside the package.

The chips are enclosed in a package that is filled with a material to provide structural stability and environmental protection to the chips inside the package and a lid is placed on the package.

The method of this invention provides a multichip hybrid package that has high performance provided by the packaging of related chips using bump technology and at the same time taking advantage of increased yield provided by being able to use tested individual peripheral chips.

The present invention is better understood upon consideration of the detailed description below, in conjunction with the accompanying drawings. As will become readily apparent to those skilled in the art from the following description, there is shown and described an embodiment of this invention simply by way of illustration of the best mode to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiments when read in conjunction with the accompanying drawings, wherein:

FIG. 2A is a side view of a section AA through the multichip module shown in FIG. 1;

FIG. 2B is a side view of a section BB through the multichip module shown in FIG. 1;

FIG. 2C is a side view of a section CC through the multichip module shown in FIG. 1; and FIG. 3 is side view of the multichip module shown in FIG. 1 in a package.

DETAILED DESCRIPTION

Figure 1:
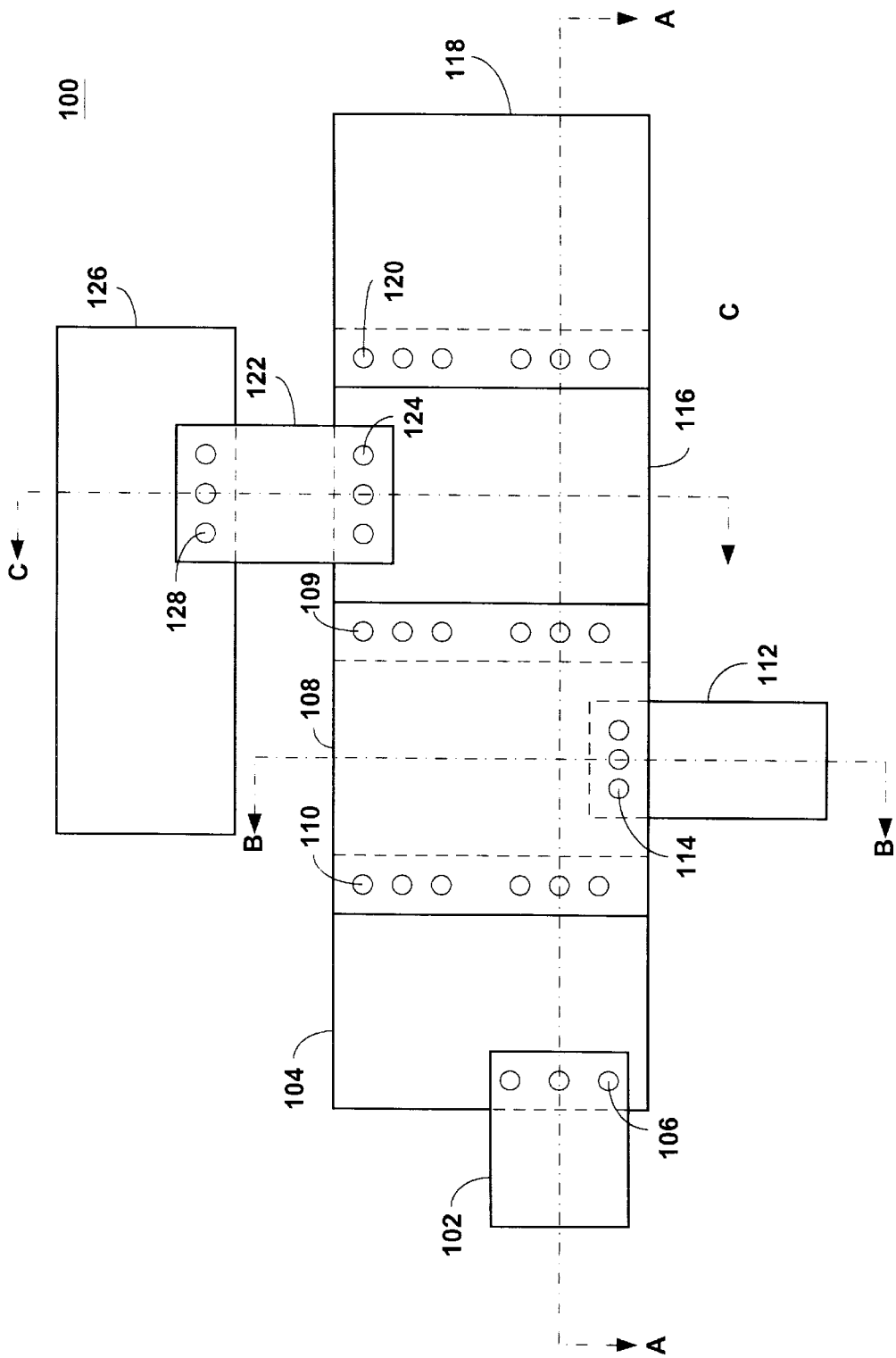
FIG. 1 is a plan view of a multichip module showing 8 chips interconnected in accordance with the present invention.

Reference is now made in detail to a specific embodiment of the present invention that illustrates the best mode presently contemplated by the inventors for practicing the invention.

FIG. 1 shows a multichip module 100 with eight chips interconnected in accordance with the present invention to form a single hybrid integrated device. The multichip module 100 has a first chip 102 and a second chip 104 interconnected by solder bumps, one of which is indicated at 106. The second chip 104 is interconnected to a third chip 108 by solder bumps, one of which is indicated at 110. A fourth chip 112 is interconnected to the third chip 108 by solder bumps, one of which is indicated at 114. A fifth chip 116 is interconnected to the third chip 108 by solder bumps, one of which is indicted at 109, and to a sixth chip 118 by solder bumps, one of which is indicated at 120. A seventh chip 122 is interconnected to the fifth chip 116 by solder bumps, one of which is indicated at 124. An eighth chip 126 is interconnected to the seventh chip 122 by solder bumps, one of which is indicated at 128. It should be appreciated that other chips could be interconnected to other regions of each chip to further interconnect other circuits to the multichip module 100. The number of chips to be interconnected is a design choice.

FIG. 2A is cross-sectional view of section AA of FIG. 1. Chip 102 is shown in a face down configuration with a substrate region 130 facing up. The chip 102 is interconnected to chip 104, which is in a face up configuration with a substrate region 132 facing down, via the solder bump 106. The chip 108, which is in a face down configuration with a substrate region 134 facing up, is interconnected to chip 104 via solder bump 110. The chip 108 is also interconnected to chip 116, which is in a face up configuration with a substrate region 136 facing down, via the solder bump 109. The chip 118, which is in a face down configuration with a substrate 138 facing up, is interconnected to the chip 116 via the solder bump 120. It should be appreciated that any one of the chips may be a central processing unit (CPU) and the other chips may be any of the standard peripheral chips such as memory chips. A typical memory chip could be an SRAM chip, a FLASH memory chip or a graphic memory chip. It also should be appreciated that the details of the active portions of the chips are not shown.

FIG. 2B shows a cross-sectional view of section BB of FIG. 1. Chip 112 is shown in a face up configuration with a substrate region 140 facing down. Chip 112 is interconnected to chip 108, which is in a face up configuration with a substrate 134 facing up, by solder bumps 110.

FIG. 2C shows a cross-sectional view of section CC of FIG. 1. Chip 126 is shown in a face up configuration with a substrate 142 facing down. Chip 126 is interconnected to chip 122, which is in a face down configuration with a substrate 144 facing up, by solder bumps 128. Chip 122 is interconnected to chip 116, which is in a face up configuration with the substrate 136 facing down.

FIG. 3 shows the multichip module 100 as it may be packaged. The module 100 is placed into a package 300 that provides structural stability for the module 100. Electrical connections 302 are provided from outside and through the package 300 to solder bumps 304, 306 & 308 that make electrical connection to active areas on chips 102, 108 & 118, respectively. It should be appreciated that some configurations would not require electrical connections to each of the indicated chips. For example, it may only be necessary to have electrical connections to chip 108. The interior portions of the package 300 are filled with a gel or epoxy to provide structure stability to the individual components as well as provide protection from environmental conditions.

In summary, the results and advantages of the method of the present invention is obtained with a multichip module made up of multiple chips interconnected using flip chip technology. The multichip module provides high performance as well as increased yields. The high performance is provided by the solder bump technology interconnections and the increased yield is provided by being able to use tested individual chips.

The foregoing description of the embodiment of the invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A multichip hybrid semiconductor device comprising:
   a package having electrical leads connecting terminals inside the package to pins outside the package;
   a first portion of a first chip electrically connected to a first portion of the electrical leads;
   a first portion of a second chip electrically connected to a second portion of the first chip using solder bump flip chip technology;
   a first portion of a third chip electrically connected to a third portion of the first chip using solder bump flip chip technology;
   a first portion of a fourth chip electrically connected to a second portion of the second chip using solder bump flip chip technology; and
   a first portion of a fifth chip electrically connected to a second portion of the third chip using solder bump flip chip technology.

2. The multichip hybrid semiconductor device of claim 1 wherein the solder bumps electrically connect electrical terminals in the first chip to the electrical leads.

3. The multichip hybrid semiconductor device of claim 2 wherein the package is filled with a material to provide structural stability and environmental protection to the chips in the package.

4. The multichip hybrid semiconductor device of claim 3 further comprising a lid on the package.

\* \* \* \* \*